(12) United States Patent
Taguchi

(10) Patent No.: US 6,614,267 B2
(45) Date of Patent: Sep. 2, 2003

(54) ELECTRONIC CIRCUIT DEVICE AND HYBRID INTEGRATED CIRCUIT WITH AN ASIC AND AN FPGA

(75) Inventor: Hideki Taguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/997,005

(22) Filed: Nov. 30, 2001

(65) Prior Publication Data

US 2002/0066956 A1 Jun. 6, 2002

(30) Foreign Application Priority Data

Dec. 1, 2000 (JP) ......................... 2000-367585

(51) Int. Cl.$^7$ ................ H03K 19/00; H01L 25/00
(52) U.S. Cl. ........................... 326/101; 326/47
(58) Field of Search .................. 326/39, 37–38, 326/40–41, 47, 101; 712/32, 36

(56) References Cited

U.S. PATENT DOCUMENTS

| | | | | |
|---|---|---|---|---|
| 5,432,708 A | * | 7/1995 | Mohsen ...................... | 716/12 |
| 5,687,325 A | * | 11/1997 | Chang ......................... | 326/39 |
| 5,765,027 A | * | 6/1998 | Wang et al. ................ | 709/213 |
| 5,844,917 A | * | 12/1998 | Salem et al. ............... | 714/724 |
| 6,334,207 B1 | * | 12/2001 | Joly et al. .................. | 386/104 |

FOREIGN PATENT DOCUMENTS

JP 6-224300 8/1994
JP 10-111864 4/1998

OTHER PUBLICATIONS

The Programmable Logic Data Book, Xilinx, Jun. 1, 1996, Version 1.0, pp. 4–5, 4–64.*

* cited by examiner

Primary Examiner—Michael Tokar
Assistant Examiner—James Cho
(74) Attorney, Agent, or Firm—Oblon, Spivak, McClelland, Maier & Neustadt, P.C.

(57) ABSTRACT

A hybrid integrated circuit in which the specification can quickly be modified and adjusted without preparing a new mask and without compromising the performance of the hybrid integrated circuit. The hybrid integrated circuit includes a common substrate on which an electrode pattern is formed; a first monolithic semiconductor chip designed as an ASIC; and a second monolithic semiconductor chip designed as an FPGA. The second monolithic semiconductor chip includes a storage element which is rewritable by a control signal through an external terminal to store circuit configuration data with which internal connections of the second monolithic semiconductor chip are modified to form a hardware configuration within the second monolithic semiconductor chip corresponding to a predetermined operational specification, and in which the first monolithic semiconductor chip and the second monolithic semiconductor chip cooperate with each other by exchanging signals through the electrode pattern of the common substrate to implement the predetermined operational specification.

8 Claims, 6 Drawing Sheets

33

33

35

35

ELECTRONIC CIRCUIT DEVICE AND HYBRID INTEGRATED CIRCUIT WITH AN ASIC AND AN FPGA

CROSS REFERENCE TO RELATED APPLICATIONS

This application is based upon and claims the benefit of priority from prior Japanese Patent Application P2000-367585 filed on Dec. 1, 2000; the entire contents of which are incorporated by reference herein.

BACKGROUND OF THE INVENTION

1. Field of the Invention

The present invention relates to a hybrid integrated circuit with an ASIC and an FPGA and an electronic circuit device.

2. Description of the Related Art

In the recent years, the semiconductor integrated circuits have been broadly utilized which are called ASICs (Application Specific Circuits) in contrast with general purpose LSIs (Large Scale Integrated Circuits). Conventionally, there are two primary approaches, as employed for the purpose of reducing the development time, to developing integrated circuits called ASICs, i.e., the use of gate arrays and the use of standard cells.

Gate arrays are integrated circuits having a fixed number of identical sites arranged in a regular manner, each site comprising a number of simple circuit elements. The circuit elements are configured in a manner which enables easy implementation of common logic circuits such as transfer gates, inverters, NAND gates, etc., depending upon how they are connected. A gate array can then be used to implement a specific circuit design simply by specifying the interconnection between the otherwise standard circuit elements. The particular interconnections of the circuit elements that are necessary to achieve a design are typically expressed as a netlist. Another approach to the design of ASIC integrated circuits is the use of standard cells. Like gate arrays, standard cell designs rely on a set of predefined circuit elements called standard cells with which to implement the design. Standard cells have been stored in a library set and are retrieved from the library set as specified by the netlist of the design. Unlike gate arrays, however, the complexity of standard cells can range from simple logic gates such as those found in gate arrays to block-level components such as RAMs, ROMs, PLAs and Maga-cells such as CPU cores.

Generally speaking, the packing density of ASIC is high to accommodate high performance hardware macrocells resulting in a higher cost performance and a shorter development time.

On the other hand, FPGAs (Field Programmable Gate Arrays) have attracted interests of engineers since FPGAs are designed to be configurable by a user while they are slower and more expensive than ASICs but require less development time and cost dispensing fabrication of a prototype (ES). Other advantages of FPGAs are quick implement of a specification, lower inventory risks, easy design changes and faster delivery of functional units to market. However, in the case of ASICs, the user must design or obtain masks for a small number of prototype samples requiring substantial development time and costs while, in the case of FPGAs, the general purpose device is generally not as fast as an ASIC with a number of useless elements and tends to be costly with quantity production.

SUMMARY OF THE INVENTION

An aspect of the present invention provides a hybrid integrated circuit comprising: a common substrate on which an electrode pattern is formed; a first monolithic semiconductor integrated circuit designed by the use of an ASIC technology and mounted on said common substrate; a second monolithic semiconductor integrated circuit designed by the use of an FPGA technology and mounted on said common substrate; and external terminals provided for said common substrate; wherein said first monolithic semiconductor integrated circuit and said second monolithic semiconductor integrated circuit cooperate with each other by exchanging signals through the electrode pattern of said common substrate in order to implement a predetermined operational specification, wherein said second monolithic semiconductor integrated circuit is provided with a storage element which is rewritable by means of a control signal given through said external terminal in order to store circuit configuration data with which internal connections of said second monolithic semiconductor integrated circuit are modified to form a hardware configuration within said second monolithic semiconductor integrated circuit corresponding to said predetermined operational specification, and wherein said first monolithic semiconductor integrated circuit operates by using part of the storage element of said second monolithic semiconductor integrated circuit as a storage area for storing data required for operation of said first monolithic semiconductor integrated circuit.

Another aspect of the present invention provides an electronic circuit device provided with a plurality of electric elements including a hybrid integrated circuit mounted on a circuit board on which an electrode pattern is formed, wherein said hybrid integrated circuit comprises a common substrate on which an electrode pattern is formed; a first monolithic semiconductor integrated circuit designed by the use of an ASIC technology and mounted on said common substrate; a second monolithic semiconductor integrated circuit designed by the use of an FPGA technology and mounted on said common substrate; external terminals provided for said common substrate; and an insulating material encapsulating said first monolithic semiconductor integrated circuit and said second monolithic semiconductor integrated circuit, wherein said second monolithic semiconductor integrated circuit is provided with a storage element which is rewritable by means of a control signal given through said external terminal in order to store first circuit configuration data with which internal connections of said second monolithic semiconductor integrated circuit are modified to form a hardware configuration within said second monolithic semiconductor integrated circuit corresponding to a basic operational specification for supporting a basic function, wherein said first monolithic semiconductor integrated circuit and said second monolithic semiconductor integrated circuit cooperate with each other by exchanging signals through the electrode pattern of said common substrate in order to implement said basic operational specification, wherein said circuit board is further provided with an extended electrode pattern for accommodating an optional electric element which can be used in order to implement an optional function and said second monolithic semiconductor integrated circuit is capable of storing second circuit configuration data with which internal connections of said second monolithic semiconductor integrated circuit are modified to form a hardware configuration within said second monolithic semiconductor integrated circuit corresponding to an extended operational specification supporting said optional function in addition to said basic function, and wherein, in the condition that said optional electric element has been mounted on said extended electrode pattern and that said second circuit configuration data has been stored in said storage element of said second monolithic semiconductor integrated circuit, said electronic circuit device is capable of operating in accordance with said extended operational specification.

A further aspect of the present invention provides a hybrid integrated circuit comprising: a common substrate on which an electrode pattern is formed;

a first monolithic semiconductor chip designed by the use of an ASIC technology and mounted on said common substrate; a second monolithic semiconductor chip designed by the use of an FPGA technology and mounted on said common substrate; and external terminals provided for said common substrate; and an insulating material encapsulating said first monolithic semiconductor chip and said second monolithic semiconductor chip, wherein said second monolithic semiconductor chip is provided with a storage element which is rewritable by means of a control signal given through said external terminal in order to store circuit configuration data with which internal connections of said second monolithic semiconductor chip are modified to form a hardware configuration within said second monolithic semiconductor chip corresponding to a predetermined operational specification, and wherein said first monolithic semiconductor chip and said second monolithic semiconductor chip cooperate with each other by exchanging signals through the electrode pattern of said common substrate in order to implement said predetermined operational specification.

BRIEF DESCRIPTION OF DRAWINGS

The aforementioned and other features and objects of the present invention and the manner of attaining them will become more apparent and the invention itself will be best understood by reference to the following description of various embodiments of the present invention taken in conjunction with the accompanying drawings, wherein:

FIG. 1A, FIG. 1B and FIG. 1C are views showing a hybrid integrated circuit in accordance with an embodiment of the present invention in which FIG. 1A is a perspective view of the hybrid integrated circuit; FIG. 1B is a cross sectional view showing the hybrid integrated circuit; and FIG. 1C is a perspective view showing a modification of the hybrid integrated circuit.

DETAILED DESCRIPTION OF EMBODIMENTS

Several embodiments of the present invention will be described with reference to the accompanying drawings.

Figure 1A:
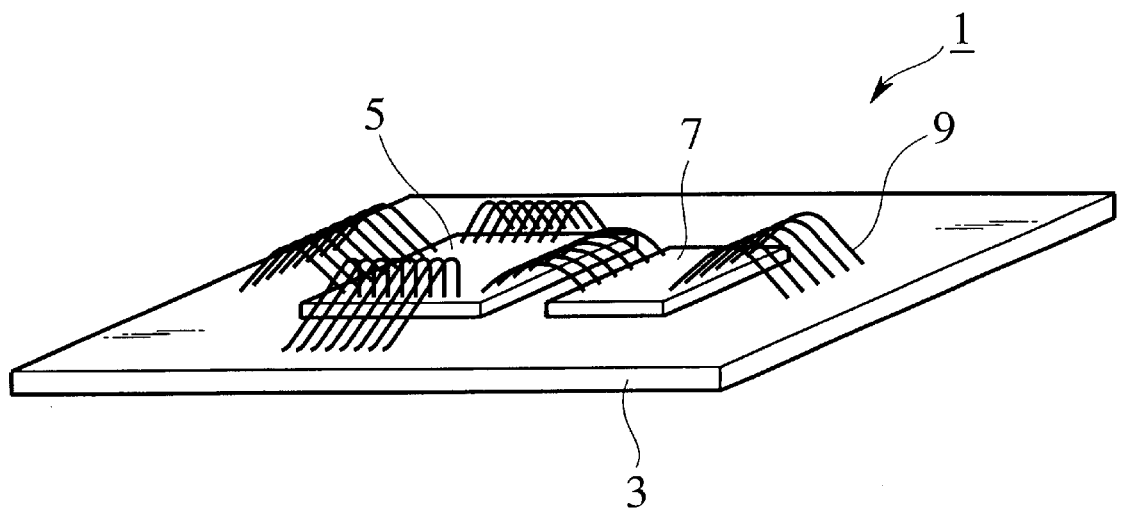
Figure 1B:
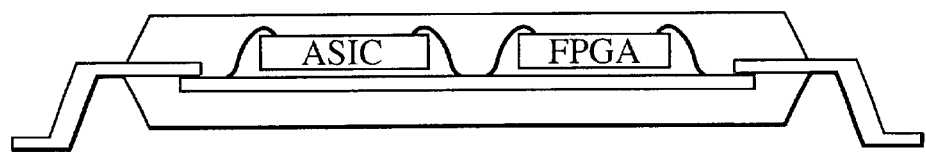

FIG. 1A and FIG. 1B are a cross sectional view and a perspective view showing a hybrid integrated circuit in accordance with an embodiment of the present invention. In this case, the hybrid integrated circuit 1 is composed of a ceramic substrate or a printed circuit board 3 as a common substrate in which are formed electrode patterns such as electrode pads for bonding, wiring patterns and so forth, a monolithic semiconductor integrated circuit 5 of an ASIC mounted on the ceramic substrate 3, another monolithic semiconductor integrated circuit 7 of an FPGA also mounted on the ceramic substrate 3 and gold wires 9 with which the monolithic semiconductor integrated circuits 5 and 7 and the ceramic substrate 3 are interconnected. These monolithic semiconductor integrated circuits 5 and 7 have been diced as semiconductor chips from a semiconductor wafer.

The monolithic semiconductor integrated circuit 5 and the monolithic semiconductor integrated circuit 7 are designed to cooperate with each other by exchanging signals through the electrode pads and the wiring patterns on the common substrate in order to implement prescribed functions. After mounting these monolithic semiconductor integrated circuits 5 and 7 on the ceramic substrate 3 and making necessary electric connection therebetween and with the electrode pads to which external leads are connected, they are sealed with an insulating material such as, e.g., an expoxy resin, in the form of multi-chip-package as an individual semiconductor integrated circuit product which provides particular functions for a specific purpose.

In this case, the ASIC 5 can be designed by the use of gate arrays or the use of standard cells, and if necessary for improving performance it can be designed by a fully customizing design technique. Generally speaking, a fully customizing design technique is difficult because of the design procedure. However, in accordance with the present invention, it is not so difficult to design the ASIC 5 by a fully customizing design technique because the functions of the ASIC 5 are limited and not so sophisticated as explained in the following description. The ASIC 5 can be manufactured in the same manner as conventional ASICs and therefore detailed description thereof is dispensed with because there is no specific information in this regard to implement an embodiment of the present invention. The FPGA 7 is a field-programmable gate array selected among from PLA (Programmable Logic Array), PLD (Programmable Logic Devise), CPLD (Complex Programmable Logic Devise) and other similar programmable devices. There are available many types of commercial programmable devices having several capacities and features. In this case, the FPGA 7 is a commercial SRAM-type FPGA or a commercial flash-type FPGA as it is.

Figure 2:
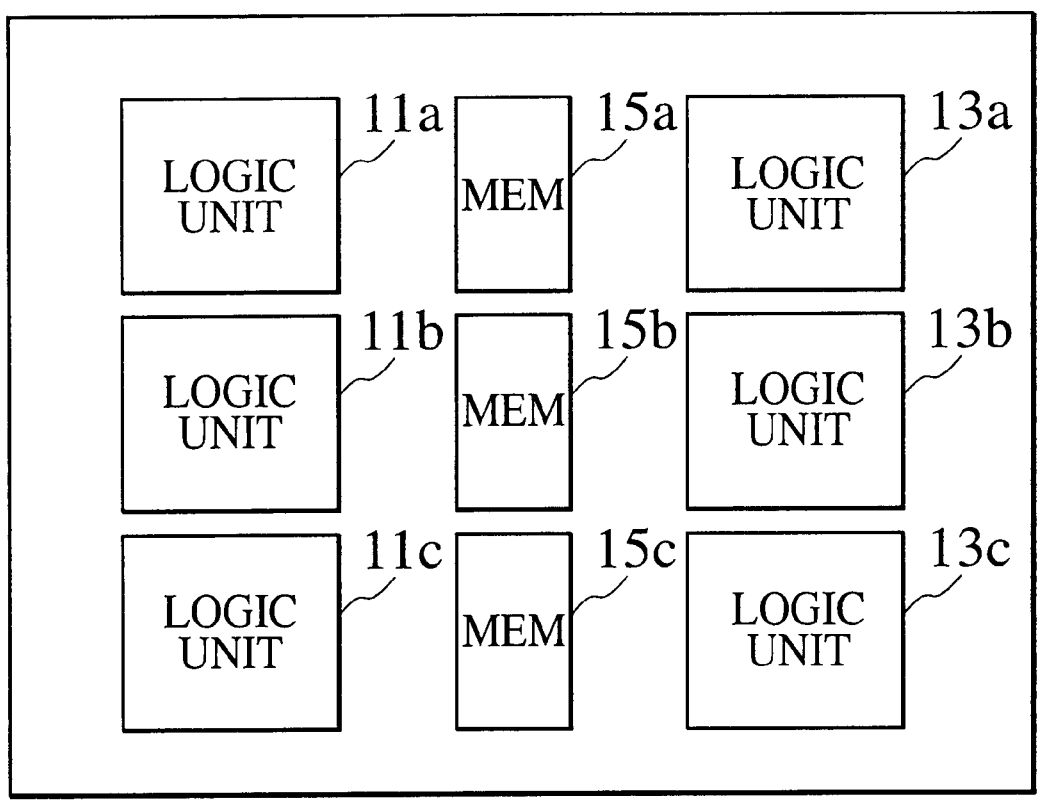
FIG. 2 is a block diagram showing the configuration of the FPGA of the hybrid integrated circuit in accordance with the embodiment of the present invention.

FIG. 2 is a block diagram showing the configuration of the FPGA of the hybrid integrated circuit in accordance with the embodiment of the present invention. As shown in the figure, there are fabricated on the semiconductor substrate a number of transistors, a number of gates, a variety of types of logic elements including a CPU core in the form of a plurality of the logic units 11a to 11c and 13a to 13c. Furthermore, an appropriate wiring network is formed over the logic units for interconnection thereamong. The wiring network is provided with a number of nodes accompanied with switching circuits for changing interconnection among the constituent logic circuits in order to realize appropriate functions required for the specification.

The positions of the switching circuits are determined by storage element blocks 15a to 15c located adjacent to the logic units 11a to 11c and 13a to 13c and implemented as SRAM blocks or flush ROM blocks. Necessary configuration of interconnection is implemented on the FPGA by transferring a bit stream (the circuit configuration data) to the storage element blocks 15a to 15c (the SRAM or flush ROM blocks) in order to set the switching circuits in appropriate positions. The bit stream (the circuit configuration data) to be stored in the storage element blocks 15a to 15c can be prepared by designing logics on the basis of a circuit description written in VHDL and the like.

In accordance with the hybrid integrated circuit of this embodiment, the specification of the system is implemented in the cooperation of the ASIC 5 and the FPGA 7. Namely, there are implemented in the ASIC chip the circuit blocks whose change is very unlikely such as, for example, the circuit blocks corresponding to fixed functions which are not changed and high performance hardware macrocells. On the other hand, there are implemented in the FPGA chip pliable circuit blocks whose change is likely such as, for example, the circuit blocks with which the user interface is determined. By this configuration, it is possible to make effective use of both the characteristics of the ASIC and the characteristics of the FPGA.

Namely, the ASIC has advantages of a high packing density to freely accommodate high performance hardware macrocells resulting in a higher cost performance and a shorter development time. On the other hand, the ASIC has disadvantages that, when the specification of the system is changed, the user must design or obtain masks for a small number of prototype samples requiring substantial development time and costs. In order to overcome the disadvantages, logic circuits, analog circuits, particular IPs, DRAMs and so forth are implemented within the ASIC while the remaining circuit blocks liable to change are implemented as the logic units of the FPGA. Accordingly, unlike a conventional technique ASIC, the ASIC 5 has not been designed in order to accomplish a set of functions in a self-contained manner by itself alone but has been designed in order that the user can use it for a specific purpose only together with the FPGA 7 which is inseparatably related to the ASIC 5. In other words, in accordance with the present invention, the FPGA 7 is designed by extracting circuit blocks liable to change as a separated chip from a conventional technique ASIC leaving the remainder to be the ASIC 5.

Another effective use of the hybrid integrated circuit in accordance with the embodiment of the present invention is an application to a printed circuit board which accommodates optional extended functions. Generally speaking, the optional functions are implemented only by means of reconfiguration of the FPGA or by means of providing additional hardware to be mounted on the printed circuit board in addition to reconfiguration of the FPGA.

Figure 3A:
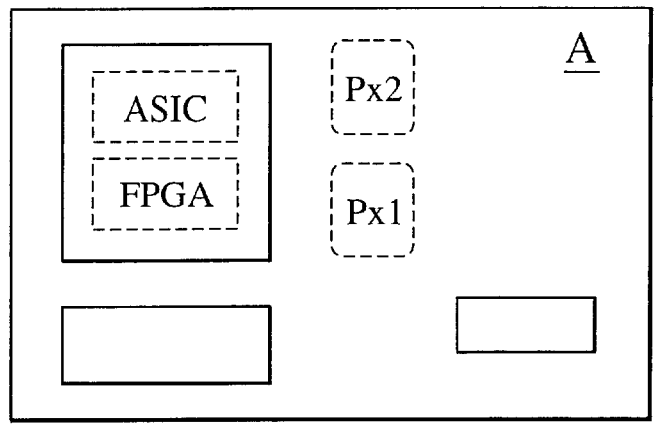
FIG. 3 is an explanatory view for explaining the advantages of an electronic circuit device in accordance with an embodiment of the present invention.
Figure 3B:
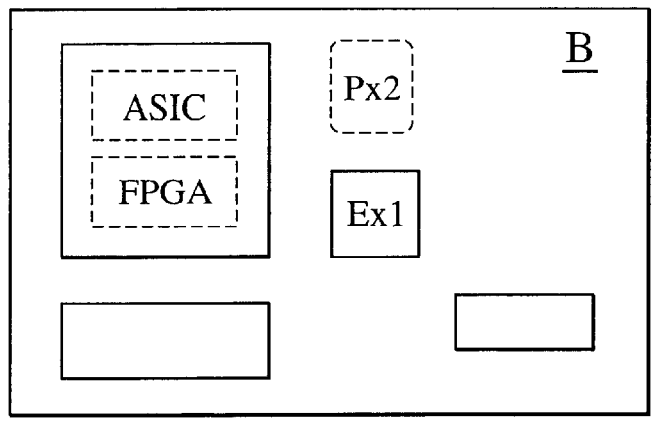
Figure 3C:
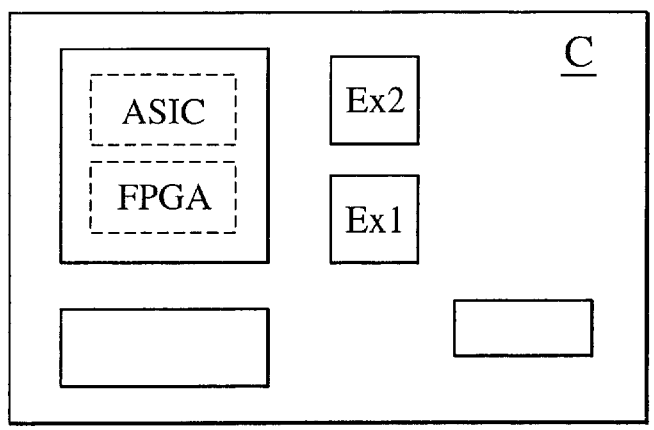

FIG. 3 is an explanatory view for explaining the characteristics of an electronic circuit device in accordance with an embodiment of the present invention. For example, the printed circuit boards A, B and C as illustrated in FIG. 3A, FIG. 3B and FIG. 3C are assembled respectively by the use of a common board. The printed circuit board is provided with an electric pattern on which the hybrid integrated circuit in accordance with the embodiment of the present invention is mounted and electrically connected thereto and electric patterns on which other circuit parts are mounted and electrically connected thereto. The electric patterns on which other circuit parts are mounted include an electric pattern Px1 and an electric pattern Px2 for accommodating an optional circuit part(s) in order to implement optional functions.

In the case of the printed circuit board A, there are mounted the hybrid integrated circuit in accordance with the embodiment of the present invention and the other circuit parts on the electric patterns while the electric pattern Px1 and the electric pattern Px2 are exposed without no circuit part thereon. By this configuration, no optional functions is implemented. On the other hand, in the case of the printed circuit board B, there are mounted the hybrid integrated circuit in accordance with the embodiment of the present invention and the other circuit parts on the electric patterns, like the printed circuit board A, while the electric pattern Px2 is exposed without no circuit part thereon but a circuit part Ex1 is mounted on the electric pattern Px1. By this configuration, optional functions are implemented. On the other hand, in the case of the printed circuit board C, there are mounted the hybrid integrated circuit in accordance with the embodiment of the present invention and the other circuit parts on the electric patterns, like the printed circuit board A, while the circuit part Ex1 and a circuit part Ex2 are mounted respectively on the electric patterns Px1 and Px2. By this configuration, further optional functions are implemented.

Accordingly, as seen from hardware configurations, the printed circuit board A, the printed circuit board B and the printed circuit board C are different only in whether or not the circuit parts are actually mounted on the electric pattern Px1 and/or the electric pattern Px2. Namely, as seen from hardware configurations, the printed circuit board B is made only by mounting the circuit part Ex1 on the electric pattern Px1 while the printed circuit board C is made only by mounting the circuit part Ex2 on the electric pattern Px2. The differential operation of the printed circuit board as introduced by the optional functions is implemented by modifying the configuration data for interconnection to be input to the FPGA in the form of bit stream. Accordingly, the printed circuit board A is manufactured as a basic device in a number of lots, some of which can be shipped after mounting the circuit part E1 and/or the circuit part E2 as advanced products implemented with the optional functions. When the FPGA is a flash-type FPGA and the electronic circuit device as formed on the printed circuit board itself is not capable of programming the flash-type FPGA as long as the flash-type FPGA has been mounted on the printed circuit board, the configuration data for interconnection has to be transferred to the flash-type FPGA in advance of assembling the electronic circuit device so that the circuit part Ex1 and/or the circuit part Ex2 has to be mounted together with the hybrid integrated circuit having been programmed.

Furthermore, the combination of an ASIC and an FPGA makes it possible not only to compensate each shortcoming respectively but also to develop a unique potential of the combination itself. While store elements can be implemented within an ASIC, as described above, an FPGA has to be provided with a storage element block(s). When having been programmed (reconfigured), in many cases, the storage element block of an FPGA includes free elements, For example, in the FPGA as illustrated in FIG. 2, it may be the case that the logic units 11a and 13a and the logic units 11b and 13b are used while the logic units 11c and 13c are not used. In this case, the storage element blocks 15a and 15b associated with the logic units 11a and 13a and the logic units 11b and 13b are used while the storage element block 15c associated with the logic units 11c and 13c is not used.

Figure 4:
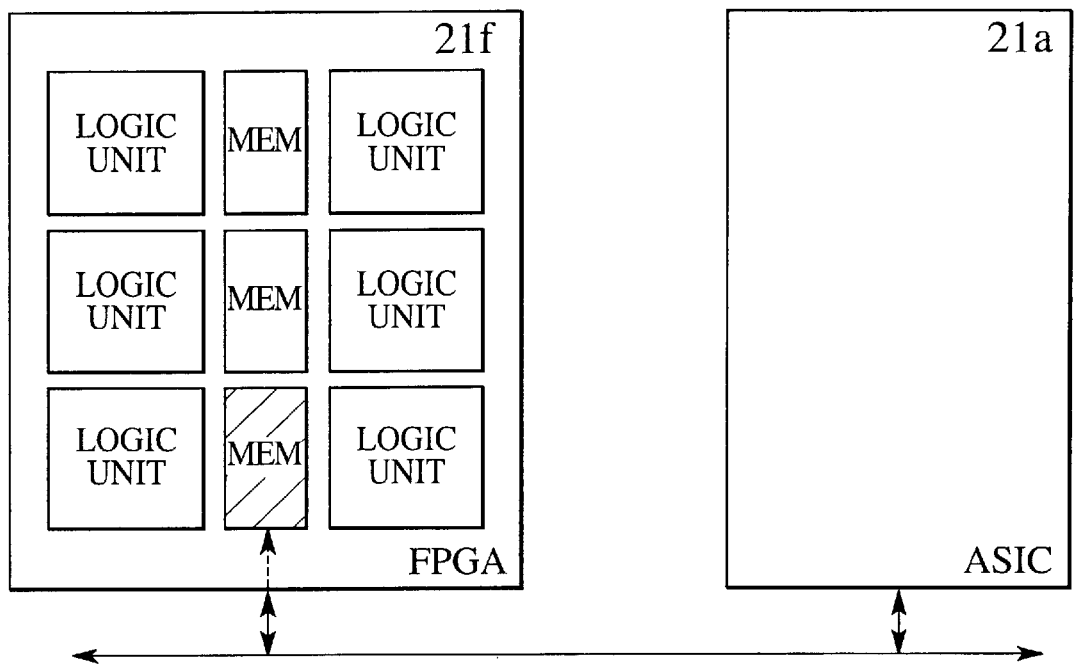
FIG. 4 is an explanatory view for showing a hybrid integrated circuit in accordance with another embodiment of the present invention having an ASIC in which a storage region is completely omitted and an FPGA including a storage element block which substitutes for the omitted storage region, as compared with a corresponding ASIC in accordance with a conventional technique.
Figure 4:
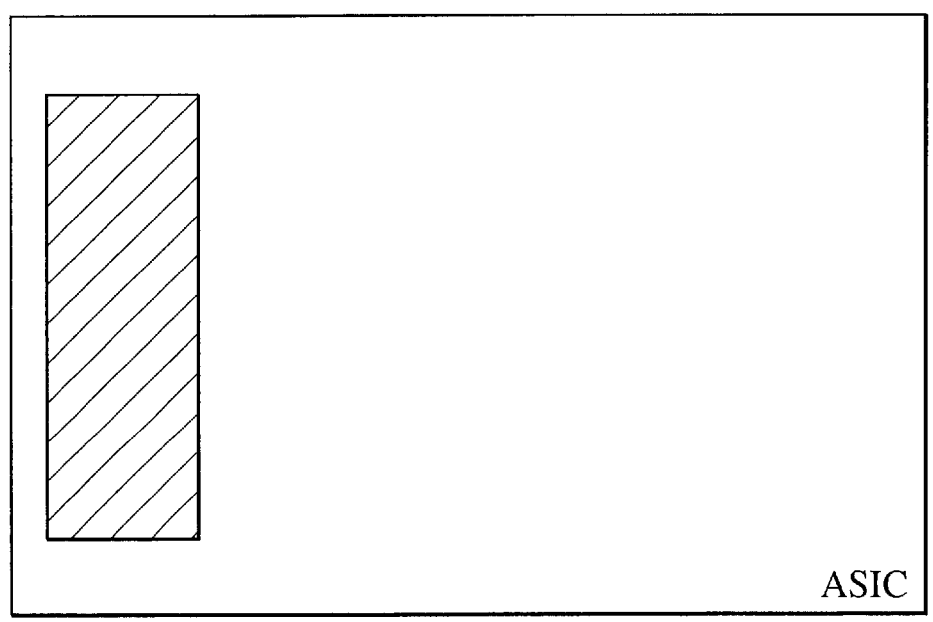

The inventor of the present invention proposes the effective use of the storage element block which is not used. Depending upon the application, the storage resources as required can be implemented only by the use of a free storage element block of the FPGA while the storage area of the ASIC is completely dispensed with. FIG. 4 is an explanatory view for showing a hybrid integrated circuit 21 in accordance with another embodiment of the present invention having an ASIC in which a storage region is completely omitted and an FPGA including a storage element block which substitutes for the omitted storage region, as compared with a corresponding ASIC 31 in accordance with a conventional technique. In accordance with the conventional technique ASIC 31, one semiconductor chip is designed to have the same functions as the ASIC 21a and the FPGA 21f of the hybrid integrated circuit 21 in accordance with the present invention. The storage region of the ASIC 31 as illustrated with hatching is corresponding to the storage element block of the FPGA 22f also as illustrated with hatching. In accordance with the hybrid integrated circuit 21 of the present invention, necessary wirings are formed on the common substrate on which are mounted the ASIC 21a and the FPGA 21f in order that the ASIC 21a can access directly to the storage element block (SRAM) of the FPGA 21f for reading and writing. The ASIC 21a makes use of the storage element block (SRAM) of the FPGA 2f through the interface which is provided for reconfiguration of the FPGA 2f.

In usual cases, the ASIC 5 in accordance with the embodiment of the present invention serves to provide certain functions by the combination with the FPGA 7 rather than by the ASIC 5 alone but can not provide practical functions without the FPGA 7. This is because the ASIC 5 is the remainder of a self-contained semiconductor design from which circuit blocks liable to change are extracted. However, depending upon the application, it is also possible to make effective use of the feature of the present invention by combining an existing commercial ASIC having certain functions in a self-contained manner and an FPGA integrated as a hybrid integrated circuit in a single package for a specific purpose. This case seems to make an impression that an ASIC and an FPGA are simply compacted in one package. However, this impression is based upoon misunderstanding.

As described above, while the development of an FPGA is relatively easy, the FPGA tends to require a larger chip area, become expensive and have a performance penalty. Accordingly, there are disadvantages in the case of the FPGA when it is required to improve the performance and/or reduce costs. By packaging an ASIC and an FPGA, it is possible not only to make compact the design but also to redesign the ASIC and the FPGA together in an equivalent single ASIC for manufacturing in high volume and reducing cost in the case when the specification has been globally acknowledged and it is unlikely to make a further change to the specification. In this case, the physical and electrical specifications of the package of the single ASIC are equivalent to those of the hybrid integrated circuit including the ASIC and the FPGA. By this configuration, as seen from the user, it is possible to make use of the semiconductor package at a relatively low cost without need for modification of the printed circuit board on which the hybrid integrated circuit has been mounted.

Figure 5A:
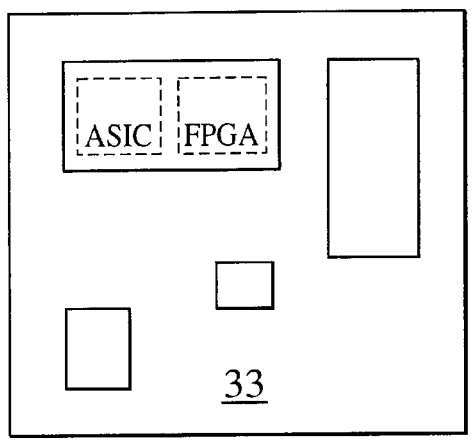
FIG. 5A through FIG. 5D are explanatory views for explaining more specifically the case where the hybrid integrated circuit in accordance with the embodiment of the present invention is replaced with a single ASIC by packaging the ASIC and the FPGA together within one chip as compared with a conventional case where two packagess of the ASIC and the FPGA are replaced with a single ASIC.
Figure 5B:
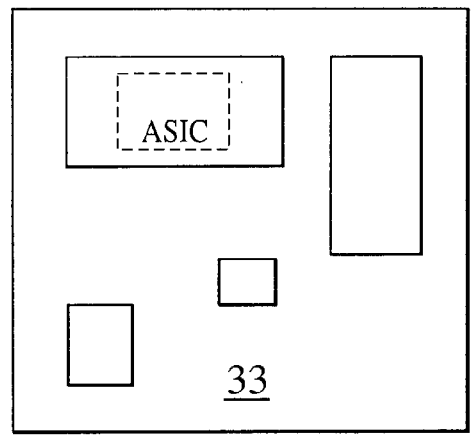
Figure 5C:
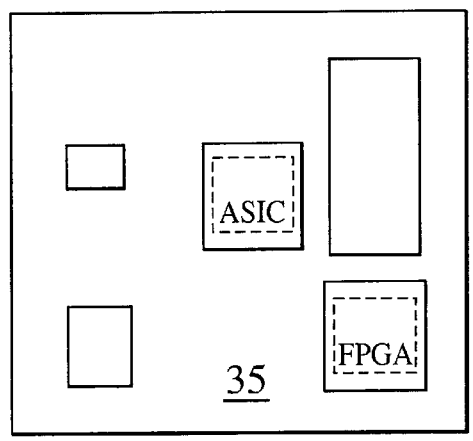

FIG. 5A through FIG. 5D are explanatory views for explaining more specifically the case where the hybrid integrated circuit in accordance with the embodiment of the present invention is replaced with a single ASIC by packaging the ASIC and the FPGA together within one chip as compared with a conventional case where two packagess of the ASIC and the FPGA are replaced with a single ASIC. With reference to FIG. 5A through FIG. 5D, it is assumed that a hybrid integrated circuit containing an ASIC and an FPGA in accordance with the embodiment of the present invention has been broadly distributed on printed circuit boards as illustrated in FIG. 5A. It is assumed that an equivalent single ASIC to the hybrid integrated circuit is redesigned by packaging the ASIC and the FPGA together for the purpose of manufacturing in high volume and reducing cost as illustrated in FIG. 5B. Since the physical and electrical specifications of the package of the single ASIC are equivalent to those of the hybrid integrated circuit including the ASIC and the FPGA, the user need not take into consideration whether the package contains the single ASIC or the pair of the ASIC and the FPGA to make use of the package on the ceramic substrate 33 as illustrated in FIG. 5A and FIG. 5B. The previous printed circuit board can be manufactured and used without change since the single ASIC is equivalent to the previous hybrid integrated circuit as seen from the assembling process. Depending on the case, since the single ASIC can operate at a higher speed, it may be possible to increase the operation clock frequency.

Figure 5D:
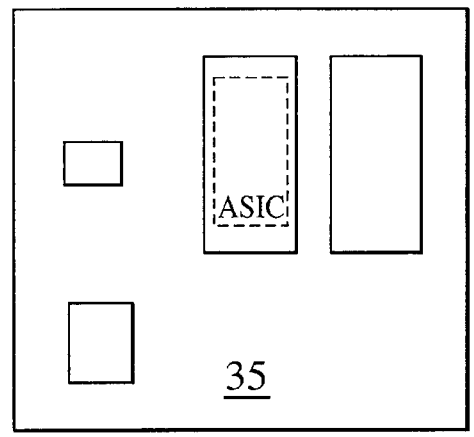

As contrasted therewith, in the case where an ASIC chip in a package and an FPGA chip in a separate package are mounted on a ceramic substrate 35 as conventionally employed, it is also assumed that an equivalent single ASIC to the combination of the separate packages is redesigned by packaging the ASIC chip and the FPGA chip together for the purpose of manufacturing in high volume and reducing cost as illustrated in FIG. 5D. The cost of the single ASIC package may be lower than the total cost of the ASIC package and the FPGA package so that it is possible to reduce the cost of supplying the necessary components. However, as clearly illustrated in FIG. 5D, it is inevitable to change the printed circuit board in order to accommodate the new ASIC package so that additional development time and costs are needed.

Figure 1C:
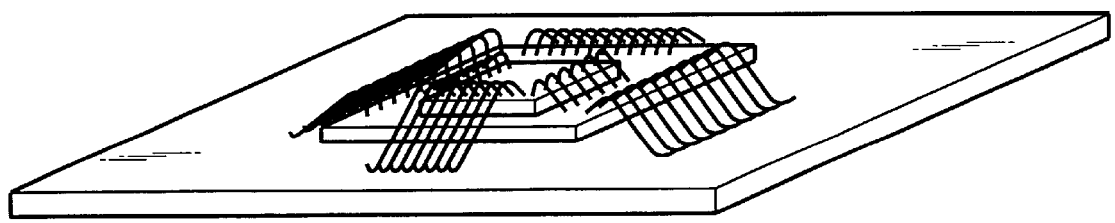
Figure 6:
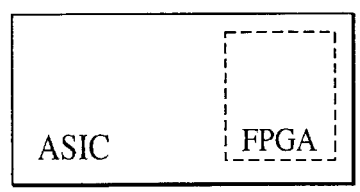
FIG. 6 is an explanatory view for showing a single monolithic semiconductor chip in which the circuit of the ASIC and the circuit of the FPGA are integrated.

On the other hand, it may be possible to integrate the circuit of the ASIC and the circuit of the FPGA in a single monolithic semiconductor chip as illustrated in FIG. 6. However, there are substantial shortcomings in this case so that the integration is not effective except for some exceptional cases. This is for the following reason. Namely, the FPGA is implemented within the ASIC as an IP (Intellectual property) designed in the ASIC technology. However, the ASIC technology has not been developed in order that a programmable flexible configuration is introduced therein so that the FPGA IP has to be designed from the ground up. Also, the conformation with each other is not easy. Also, as compared with a general purpose FPGA device, the built-in FPGA IP tends to cost more while the performance of the built-in FPGA is lower than that of a corresponding general purpose FPGA. Furthermore, the size is little decreased as compared with the equivalent combination of an ASIC chip and an FPGA chip mounted on the ASIC chip as illustrated in FIG. 1C which will be explained in the followings.

Explained in what follows is an exemplary application to which is applied the hybrid integrated circuit in accordance with an embodiment of the present invention. In this exemplary case, the hybrid integrated circuit is applied to an encryption/decryption device.

Figure 7:
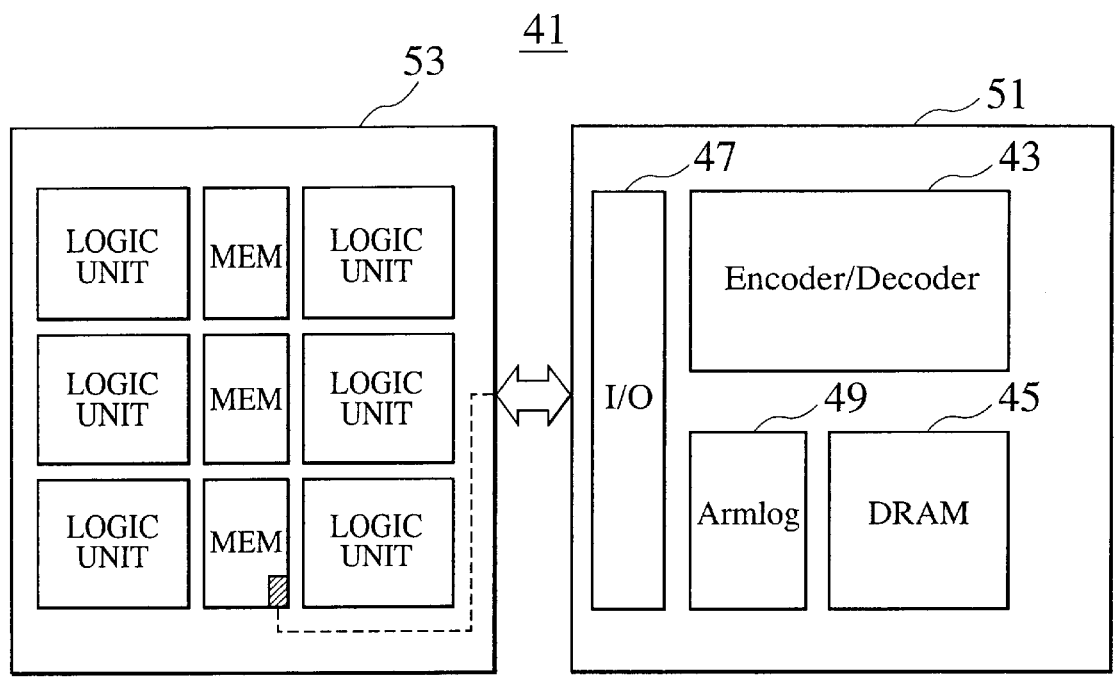
FIG. 7 is a block diagram showing an encryption/decryption device equipped with the hybrid integrated circuit in accordance with an embodiment of the present invention.

FIG. 7 is a block diagram showing an encryption/decryption device 41 equipped with the hybrid integrated circuit in accordance with an embodiment of the present invention. The encryption/decryption device 41 is composed of an ASIC 51 and an FPGA 53 which are mounted on a common substrate as explained heretofore. The ASIC 51 is a semiconductor chip serving to perform the encryption/decryption process and composed of an encoder/decoder 43, a DRAM 45, an I/O interface circuit 47 and an analog circuit 49. The encoder/decoder 43 is implemented with necessary libraries of encryption/decryption algorithms.

The logics of the libraries of encryption/decryption algorithms need not be modified after selecting appropriate algorithms. The encoder/decoder 43 is implemented with a processor including an ALU therein. The DRAM 45 serves to provide a working memory area required for the encoder/decoder 43 to operate so that, as long as an sufficient capacity of the memory has been procured in advance, the hardware of the DRAM 45 need not be modified even if the specification of the system is changed. The I/O interface circuit 47 serves to support an interface protocol to the FPGA 53. As long as the interface protocol is appropriate, the hardware of the I/O interface circuit 47 need not be modified even if the specification of the system is changed. The analog circuit 49 serves to perform digital/analog signal processing and is implemented with an existing IP serves to the hardware thereof need not be modified even if the specification of the system is changed.

On the other hand, the FPGA 53 is implemented with a general purpose flash-type FPGA which is provided with a flush memory. In this case, a control logic is implemented within the FPGA 53 in order to perform the encryption/decryption processing by means of the ASIC 51. Particularly, a user interface is implemented by means of the FPGA 53. These features of the FPGA 53 are often modified during development repeating trial manufacture.

In the case of the encryption/decryption device 41 as implemented with the hybrid integrated circuit in accordance with the embodiment of the present invention, a surplus area of the flush memory of the FPGA 53 (the area as hatched in FIG. 7) is used to save an encryption key. Since the FPGA 53 is a general purpose FPGA, it is usually not the case that all the arrays are used up. Accordingly, it is possible to secure a sufficient space for saving an encryption key. Furthermore, it is possible to almost completely conceal the encryption key by distributing the product after the encryption key has been saved in the FPGA 53 by the manufacturer (the user of the hybrid integrated circuit) and mounted on a printed circuit board in the manner that the FPGA 53 is no more rewritable on the printed circuit board. Alternatively, it is possible to use the surplus area of the flush memory of the FPGA 53 for saving the ID code (serial number) of the hybrid integrated circuit for distinguishing the individual product.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

Figure 8:
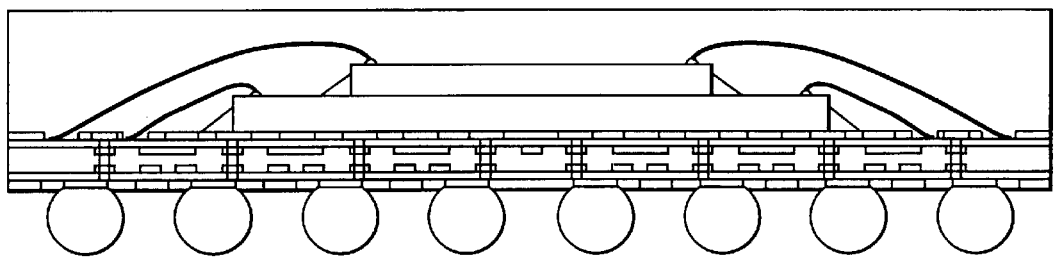
FIG. 8 is a cross sectional view showing a modification of the hybrid integrated circuit in accordance with an embodiment of the present invention as packaged with BGA (the ball grid array).

For example, while the ASIC 5 and the FPGA 7 are mounted side by side on the ceramic substrate 3 in the case of the hybrid integrated circuit in accordance with the present invention as illustrated in FIG. 1A and FIG. 1B, it is also possible to mount the ASIC 5 on the ceramic substrate 3 and then mount the FPGA 7 on the ASIC 5 as illustrated in FIG. 1C with a group of solder or gold balls for electrical connection therebetween. Inversely, it is possible to mount the FPGA 7 on the ceramic substrate 3 and then mount the ASIC 5 on the FPGA 7 with a group of solder or gold balls for electrical connection therebetween. This is called a stack type of the hybrid integrated circuit. Also, the external terminals of the hybrid integrated circuit may be designed not only as QFP (Quad Flat Package) as illustrated in FIG. 1A but also as BGA (the ball grid array) as illustrated in FIG. 8. In this case, the electrodes provided at the bottom surface of the hybrid integrated circuit function as the external terminals.

Furthermore, while only one ASIC and only one FPGA are combined in the case of the above described embodiments, it may be effective to make a combination of two ASIC and one FPGA, a combination of one ASIC and two FPGA or other combination including four or more chips in order to implement a larger scale hybrid integrated circuit.

As detailedly explained in the above, in accordance with the hybrid integrated circuit of the present invention, it is possible to make effective use of both the characteristics of an ASIC and the characteristics of an FPGA. Namely, it is possible to provide a hybrid integrated circuit whose specification can quickly be modified and adjusted without need for preparing a new mask and without need for compromising the performance of the hybrid integrated circuit. Namely, there are many advantages, i.e., the reduction of production cost and the flexibility (programmablility) responsible to the change of the specification of the system. Also, when the hybrid integrated circuit is implemented with a general purpose flash-type FPGA, a surplus area of the flush memory of the FPGA is used as a non-volatile storage for operation of the ASIC of the hybrid integrated circuit. Furthermore, when the hybrid integrated circuit is implemented with a general purpose SRAM-type FPGA, a surplus area of the SRAM of the FPGA is used as a temporary storage for operation of the ASIC of the hybrid integrated circuit. Accordingly, it is possible to reduce the cost and minimize the size of the hybrid integrated circuit and the amount of real estate or area it occupies on the circuit board.

What is claimed is:

1. A hybrid integrated circuit comprising:
   a common substrate on which an electrode pattern is formed;
   a first monolithic semiconductor integrated circuit designed by the use of an ASIC technology and mounted on said common substrate;
   a second monolithic semiconductor integrated circuit designed by the use of an FPGA technology and mounted on said common substrate; and
   external terminals provided for said common substrate;
   wherein said first monolithic semiconductor integrated circuit and said second monolithic semiconductor integrated circuit cooperate with each other by exchanging signals through the electrode pattern of said common substrate in order to implement a predetermined operational specification, wherein said second monolithic semiconductor integrated circuit is provided with a storage element which is rewritable by means of a control signal given through said external terminal in order to store circuit configuration data with which internal connections of said second monolithic semiconductor integrated circuit are modified to form a hardware configuration within said second monolithic semiconductor integrated circuit corresponding to said predetermined operational specification, and wherein said first monolithic semiconductor integrated circuit operates by using part of the storage element of said second monolithic semiconductor integrated circuit as a storage area for storing data required for operation of said first monolithic semiconductor integrated circuit.

2. The hybrid integrated circuit as claimed in claim 1 wherein said first monolithic semiconductor integrated circuit accesses to the part of the storage element of said second monolithic semiconductor integrated circuit through an interface which is provided in said second monolithic semiconductor integrated circuit for storing said circuit configuration data in order to use the part of the storage element of said second monolithic semiconductor integrated circuit as the storage area for storing the data required for operation of said first monolithic semiconductor integrated circuit.

3. The hybrid integrated circuit as claimed in claim 1 wherein the storage element of said second monolithic semiconductor integrated circuit is a flush memory.

4. The hybrid integrated circuit as claimed in claim 1 wherein the storage element of said second monolithic semiconductor integrated circuit is an SRAM.

5. An electronic circuit device provided with a plurality of electric elements including a hybrid integrated circuit mounted on a circuit board on which an electrode pattern is formed, wherein said hybrid integrated circuit comprises a common substrate on which an electrode pattern is formed; a first monolithic semiconductor integrated circuit designed by the use of an ASIC technology and mounted on said common substrate; a second monolithic semiconductor integrated circuit designed by the use of an FPGA technology and mounted on said common substrate; external terminals provided for said common substrate; and an insulating material encapsulating said first monolithic semiconductor integrated circuit and said second monolithic semiconductor integrated circuit, wherein said second monolithic semiconductor integrated circuit is provided with a storage element which is rewritable by a control signal given through said external terminal in order to store first circuit configuration data with which internal connections of said second monolithic semiconductor integrated circuit are modified to form a hardware configuration within said second monolithic semiconductor integrated circuit corresponding to a basic operational specification for supporting a basic function, wherein said first monolithic semiconductor integrated circuit and said second monolithic semiconductor integrated circuit cooperate with each other by exchanging signals through the electrode pattern of said common substrate in order to implement said basic operational specification, wherein said circuit board is further provided with an extended electrode pattern for accommodating an optional electric element which can be used in order to implement an optional function, which is not implemented without said optional electric element, and said second monolithic semiconductor integrated circuit is capable of storing second circuit configuration data with which internal connections of said second monolithic semiconductor integrated circuit are modified to form a hardware configuration within said second monolithic semiconductor integrated circuit corresponding to an extended operational specification supporting said optional function in addition to said basic function, and wherein, in the condition that said optional electric element has been mounted on said extended electrode pattern and that said second circuit configuration data has been stored in said storage element of said second monolithic semiconductor integrated circuit, said electronic circuit device is capable of operating in accordance with said extended operational specification.

6. The electronic circuit device as claimed in claim 5 wherein, after storing said first circuit configuration data in said storage element of said second monolithic semiconductor integrated circuit, said second monolithic semiconductor integrated circuit is mounted on said circuit board while the data stored in said storage element of said second monolithic semiconductor integrated circuit can not be rewritten by the operation of said electronic circuit device.

7. A hybrid integrated circuit comprising:

a common substrate on which an electrode pattern is formed;

a first monolithic semiconductor chip designed by the use of an ASIC technology and mounted on said common substrate;

a second monolithic semiconductor chip separate from said first monolithic semiconductor integrated circuit and designed by the use of an FPGA technology and mounted on said common substrate; and external terminals provided for said common substrate; and an insulating material encapsulating said first monolithic semiconductor chip and said second monolithic semiconductor chip, wherein said second monolithic semiconductor chip is provided with a storage element which is rewritable by a control signal given through said external terminal in order to store circuit configuration data with which internal connections of said second monolithic semiconductor chip are modified to form a hardware configuration within said second monolithic semiconductor chip corresponding to a predetermined operational specification, and wherein said first monolithic semiconductor chip and said second monolithic semiconductor chip cooperate with each other by exchanging signals through the electrode pattern of said common substrate in order to implement said predetermined operational specification.

8. A hybrid integrated circuit comprising:

a common substrate on which an electrode pattern is formed;

a first monolithic semiconductor chip designed by the use of an ASIC technology and mounted on said common substrate;

a second monolithic semiconductor chip designed by the use of an FPGA technology and mounted on said common substrate; and external terminals provided for said common substrate; and an insulating material encapsulating said first monolithic semiconductor chip and said second monolithic semiconductor chip, wherein said second monolithic semiconductor chip is provided with a storage element which is rewritable by a control signal given through said external terminal in order to store circuit configuration data with which internal connections of said second monolithic semiconductor chip are modified to form a hardware configuration within said second monolithic semiconductor chip corresponding to a predetermined operational specification, wherein said first monolithic semiconductor chip and said second monolithic semiconductor chip cooperate with each other by exchanging signals through the electrode pattern of said common substrate in order to implement said predetermined operational specification, and wherein said first monolithic semiconductor chip accesses to a part of the storage element of said second monolithic semiconductor chip through an interface which is provided in said second monolithic semiconductor chip for storing said circuit configuration data in order to use the part of the storage element of said second monolithic semiconductor chip as a storage area for storing data required for operation of said first monolithic semiconductor chip.

* * * * *